(12) United States Patent
Dietrich

(10) Patent No.: US 7,026,572 B2
(45) Date of Patent: Apr. 11, 2006

(54) STRIPPING INSULATION FROM FLAT CABLES

(75) Inventor: Jörn Dietrich, Siegendorf (AT)

(73) Assignee: I & T Innovation Technology Entwicklungs-und Holding Aktiengesellschaft, Siegendorf (AT)

( * ) Notice: Subject to any disclaimer, the term of this patent is extended or adjusted under 35 U.S.C. 154(b) by 80 days.

(21) Appl. No.: 10/767,153

(22) Filed: Jan. 29, 2004

(65) Prior Publication Data

US 2004/0182837 A1    Sep. 23, 2004

(30) Foreign Application Priority Data

Jan. 29, 2003    (EP) .................................. 03450029

(51) Int. Cl.
*B23K 26/00* (2006.01)
*B23K 26/14* (2006.01)
*B23K 26/16* (2006.01)
*B23K 26/18* (2006.01)

(52) U.S. Cl. ..................... 219/121.69; 219/121.67; 219/121.85

(58) Field of Classification Search ........... 219/121.69, 219/121.68, 121.67, 121.85, 121.65, 121.66; 15/88, 77; 81/9.51
See application file for complete search history.

(56) References Cited

U.S. PATENT DOCUMENTS

| | | | | |
|---|---|---|---|---|
| 2,513,262 | A * | 6/1950 | Carpenter et al. | 15/88.2 |
| 3,694,843 | A * | 10/1972 | Seifert | 15/88 |
| 4,671,848 | A * | 6/1987 | Miller et al. | 216/65 |
| 4,818,322 | A * | 4/1989 | Morino et al. | 156/272.8 |
| 4,931,616 | A * | 6/1990 | Usui et al. | 219/121.68 |
| 4,970,367 | A * | 11/1990 | Miller | 219/121.68 |
| 5,115,555 | A * | 5/1992 | Olsson et al. | 29/566.3 |
| 5,630,341 | A * | 5/1997 | Hoffa | 81/9.51 |
| 5,940,963 | A * | 8/1999 | Tolmie et al. | 29/828 |
| 6,130,404 | A * | 10/2000 | Campagna et al. | 219/121.69 |
| 6,509,547 | B1 * | 1/2003 | Bernstein et al. | 219/121.68 |

FOREIGN PATENT DOCUMENTS

| | | |
|---|---|---|
| DE | 100 64 696 A1 | 7/2002 |
| JP | 01 136396 | 5/1989 |
| JP | 04 033510 | 2/1992 |
| JP | 2002 027626 | 1/2002 |

* cited by examiner

*Primary Examiner*—M. Alexandra Elve
(74) *Attorney, Agent, or Firm*—Merchant & Gould

(57) ABSTRACT

A method for stripping insulation from a region, a so-called window, of a flat cable, a so-called FFC, by means of a laser. The laser used to form the window, preferably a $CO_2$ laser, operates only in the edge region of the window, and in a subsequent step the remaining insulation in the interior of the window is removed. This remaining insulation is preferably removed by means of a type of doctor blade or a brush.

10 Claims, 2 Drawing Sheets

Figure 3:
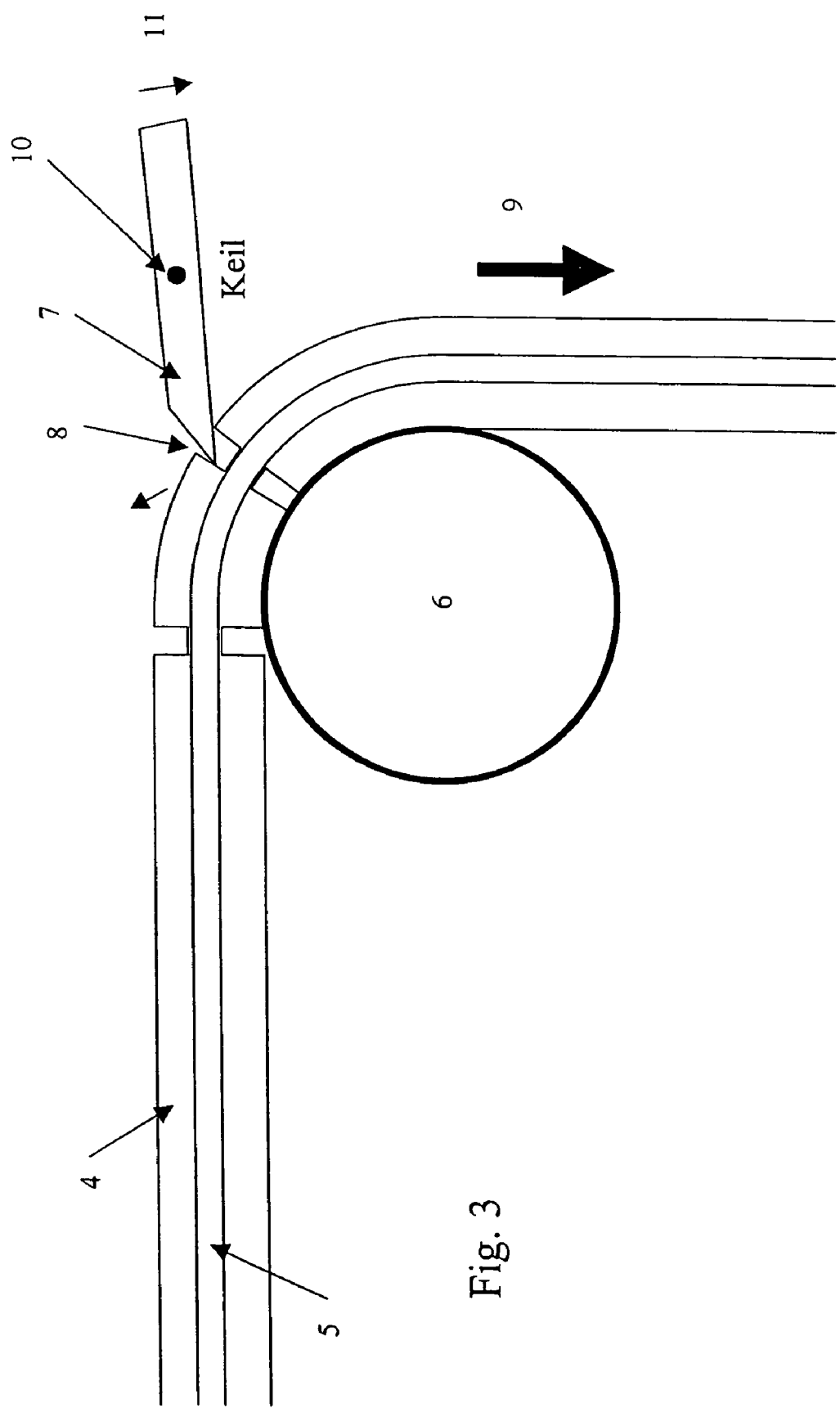

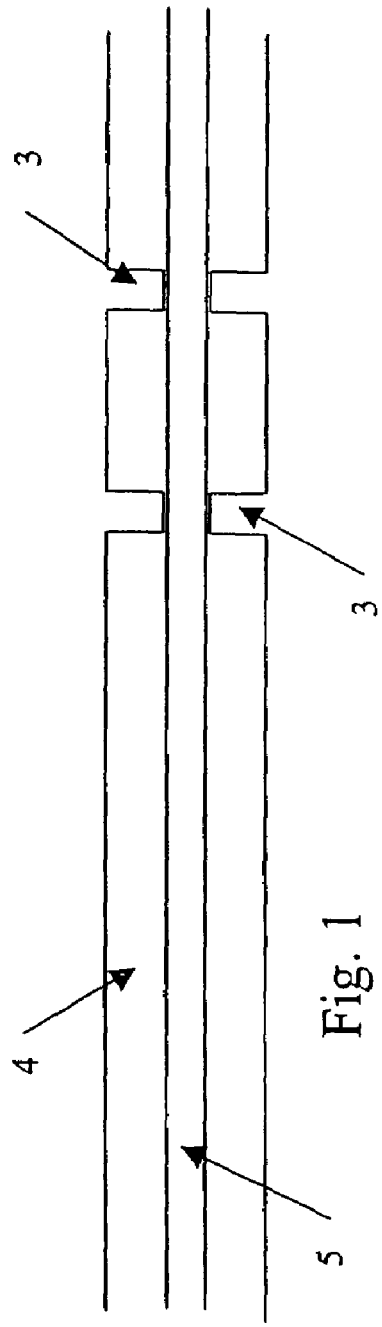
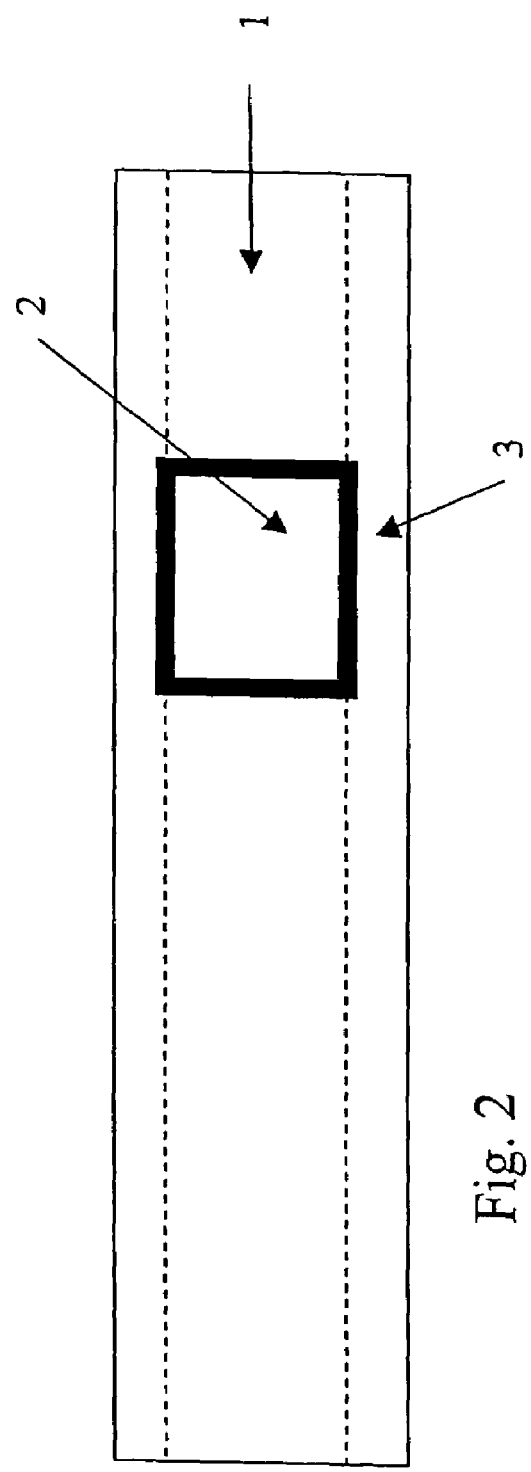

STRIPPING INSULATION FROM FLAT CABLES

The invention relates to stripping insulation from flat cables with the aid of a laser. Flat cables, so-called FFCs, are being used increasingly, especially in the automobile industry, for producing cable trees, since, in contrast to round cables, flat cables can be manipulated by robots and are therefore preferred to round cables, especially in the production of cable trees for motor vehicles, but also in other industrial applications.

Methods for stripping insulation from an FFC are known in various forms:

JP 2002 027 626 A proposes the use of a $CO_2$ laser for avoiding burning and due to its good adjustability.

JP 04 033 510 A combines a laser beam with a stripper in order to simplify the peeling of the insulation layer from the conductive lead.

JP 01 136 396 A uses a laser beam and a mirror lying under a round wire to dissolve the insulation of the wire.

From U.S. Pat. No. 4,931,616 A, it is known to split a laser beam and to direct it onto an FFC from both sides in order to remove the cable's insulation.

From DE 100 64 696 A, it is known to produce windows in the FFC by means of a laser or to connect FFCs set one on top of the other, e.g., by means of ultrasonic welding without prior insulation stripping.

In principle, two types of FFCs can be distinguished: laminated and extruded. Laminated FFCs consist of electrically conductive leads, usually made from copper, which are adhered parallel to each other between two films, and thus are insulated from the outside and from each other. The films can have multiple layers or more than two films can be used.

Extruded FFCs consist of conductive leads, which are guided through special extrusion machines, where an electrically insulating extruded material is molded or injected around the leads, so that the individual conductive leads are insulated from the outside and from each other by the extruded material.

The present invention relates to both types of FFCs.

In both cases, the cross sections of the actual conductive leads can be round, oval, rectangular, or any other shape.

The use of FFCs, regardless of type, enables branches or connections to be produced, where the insulating material is removed at the desired locations in the FFCs to be connected, which can be described as: "windows are made," and the FFCs are laid one on top of the other in alignment. The now exposed conductive leads located at a small distance from each other or already touching are connected to each other, e.g., by soldering, welding, etc., and the insulation from the outside is realized again usually through adhesive material, adhesive film, or the like.

In addition, it can also be necessary to strip insulation in the end region of an FFC in order to be able to attach plugs, contacts, or the like.

It has usually proven to be necessary to expose the conductive leads on both sides even in the originally mentioned case of the window formation, because only in this way can a mechanically stable and electrically reliable connection be formed between conductive leads lying one on top of the other.

When stripping insulation during window formation, care must be taken that the geometry of these windows corresponds as exactly as possibly to the desired geometry and that the insulating material is removed as completely as possible. After the formation of the window, the conductive leads must be present in a state, and here in a surface state, which permits a reliable electrical connection, and preferably also a mechanically stable connection of the conductive leads lying one on top of the other without complicated preparation.

Previously used methods are of the mechanical type and consist of a combination of stamping technology and a peeling procedure in the region already stamped up to the conductive lead. Unavoidable production tolerances, particularly for extruded FFCs, for which the conductive leads "swim" in the solidifying extrudate without separate guidance and alignment until the extrudate has solidified, lead to problems with extrudate residue remaining on the conductive leads, which leads to damage to the conductive leads at the positions, where the conductive lead is off-center in the extrudate.

During attempts to remove the insulation by means of a laser, it has come to light that this method produces surface properties of the conductive leads that make a subsequent, complicated wet-chemical treatment necessary, and thus this method cannot be used for regular production quantities and cycle times.

One should not forget that such treatment with liquid chemicals makes necessary an intermediate station in the production sequence, where the chemicals are brought under an exhaust hood and removed again after their actions, because it is necessary to dry the corresponding positions of the FFCs led through the station and to retest these cables and because the used chemicals are not only prepared, but also reprocessed, and in the end must be disposed of. For these reasons, it is basically inconvenient and undesirable to handle such chemicals in a production process between processing stations equipped with mechanical, electrical, and laser systems.

The objective of the invention is to present a method that does not exhibit the mentioned disadvantages, but instead realizes the production of windows in FFCs in a reliable manner, adapted to the entire production process, wherein subsequent treatment of the surfaces of the conductive leads can be eliminated, and the FFCs provided with windows are either further processed directly or supplied to a station in which the surfaces of the exposed conductive lead sections are coated appropriately in order to form an electrically conductive surface, which is problem-free and which can be soldered or welded reliably, even for subsequent long-term storage, where the FFCs manufactured in this way can be stored in an arbitrary manner.

According to the invention, these objectives are realized by operating the laser, preferably a $CO_2$ laser, which is used to form the windows, only in the border region of the insulation window and by removing the remaining insulation in the center of the window in a subsequent step.

For this purpose, mechanical, thermal, or other physical methods can be employed. Here, it is advantageous if the insulation layer in this central window region still has its full layer thickness, and thus offers better choices for its removal.

For example, for removing the insulation in the central region of the window, the FFC can be rolled over a roll with a small diameter, preferably between 2.5 and 30 mm, wherein on the surface of the FFC, a wedge, which can be spring-mounted, according to a type of doctor blade, bites into the border of the insulation window and pulls away or lifts the insulation, thereby removing it. Therefore, in the center of the window, the blank metallic surface of the copper is exposed without causing damage that would have to be further processed in subsequent processing steps.

It is further possible to use, instead of the wedge, a brush that moves relative to the FFC (e.g., a rotating brush), wherein the axis of rotation of the brush is parallel to the axis of the roll. The direction of rotation of the brush should preferably be against the forward movement of the FFC at the contact radius.

In this way, the problems of the previously known methods are actually avoided and the objectives according to the invention are realized.

Another advantage of the method according to the invention is the reduction of the processing time, since the laser need only move along the border, and not the entire surface, of the insulation window and since the remainder of the insulation is stripped by the blade quickly and nearly independently of the size of the window.

The invention is explained in more detail below with reference to the drawing. Here, FIG. 1 shows a purely schematic section through an FFC after the removal of the window edge by means of a laser, FIG. 2 shows a purely schematic top view, and FIG. 3 shows a schematic representation of the peeling procedure according to the invention.

As follows from FIGS. 1 and 2, the edge region 3 of a window 2 to be formed in the FFC 1 is produced in a known way by means of a laser, preferably a $CO_2$ laser. In this way, essentially the entire insulating material 4, which electrically insulates the actual lead 5 usually consisting of copper or a copper alloy, is removed on both sides of the FFC 1. In FIG. 1, traces of a residual region of the insulating material 4 is shown in the region of frame 3.

FIG. 3 shows purely schematically the removal of the insulating material in the region of the actual window 2, which is performed as follows: the length of FFC 1, stretched tightly, is guided over a roll 6, whose diameter preferably equals a maximum of 5–60 times the thickness of the FFC. In the region in which the boundary layer between the insulating material 4 and lead 5 is already curved, a wedge or blade 7 is placed, whose width (that is, its extent perpendicular to the longitudinal axis of the FFC and parallel to the axis of curvature of the roll 6) is at least essentially equal to the width of the window 2, but is in no way greater than the outer width of the window frame 3, with the cut previously in the boundary region between the insulating material 4 and the lead 5. For further movement of the FFC 1 in the direction of arrow 9, the insulating material in the region of the window 2 is accurately peeled, whereby the bare surface of the lead 5 to be further treated or connected directly is exposed in the region of the window 2. Because it is necessary in most applications to expose the lead 5 in the region of the window 2 on both sides, as shown in FIGS. 1 and 3, the removal of the insulating material on the inner side of the window 2 in FIG. 3 is performed completely analogously to the shown removal of the outer region, either in a subsequent processing station for the case of continuous operation or through repeated passage through the shown processing station with an inverted FFC for step-by-step production.

In the embodiment shown, the FFC 1 has a single lead 5. Obviously, in most practical applications this is not the case, instead the FFC will have several leads, which are arranged one next to the other and which are electrically insulated from each other. In addition, typically only individual leads are to be made accessible by means of windows. This change of geometry or dimensions, however, does not affect anything regarding the execution of the method according to the invention.

In FIG. 3, the knife 7 is shown as a simple, straight-line, wedge-shaped instrument. Obviously, the shape of the knife 7 can deviate from the form shown, depending on the geometric requirements. As shown in FIG. 3, the simple tilting motion of the knife 7 about the axis 10 in the direction of the arrow 11 or in the opposite direction is also not absolutely necessary. A linear or combined rotating and pushing motion is also possible when the knife 7 is set or removed.

Finally, instead of the roll 6, a stationary, rounded edge can be used, over which the FFC 1 is pulled. In contrast, an advantage for the use of the roll 6 is that the friction during normal advance and thus the expansion of the FFC is essentially reduced, wherein during the peeling process the roll can be driven synchronously with the forward motion 9 of the FFC in order to guarantee positioning and guidance that is as precise as possible. Here, the surface of the roll can be formed so that it exhibits a high coefficient of friction relative to the insulating material of the FFC 1 and in this way supports the positioning as much as possible. In contrast, for the use of a stationary, rounded edge, a surface with a low coefficient of friction that is as smooth as possible relative to the material of the FFC is a basic condition.

The invention claimed is:

1. Method for stripping insulation from a window region, of a flat cable, a (FFC), by means of a laser characterized in that the laser used to form the window operates on only an edge region of the window, and in that the remaining insulation in the interior of the edge region of the window is removed in a subsequent step.

2. Method according to claim 1, characterized in that the remaining insulation in the interior of the window is removed by means of mechanical, thermal, or some other physical method.

3. Method according to claim 2, characterized in that the FFC is rolled over a roll with a small diameter, to curve the edge region, and on the curved surface of the FFC, a wedge, like a type of doctor blade, bites into the edge region of the window exposed by the laser and pulls away or lifts the insulation, thus removing the insulation.

4. Method according to claim 3, characterized in that the wedge can pivot about an axis that runs parallel to the axis of the roll.

5. Method according to claim 2, characterized in that the FFC is rolled over a roll with a small diameter to curve the edge region, and at the curved surface of the FFC, a brush bites into the edge region of the window exposed by the laser and pulls away or lifts the insulation thereby, removing the insulation.

6. Method according to claim 5, characterized in that the brush can rotate about an axis that runs parallel to the axis of the roll.

7. Method according to claim 6, characterized in that the direction of rotation of the brush in the contact region with the FFC is opposite a forward direction of the FFC.

8. The method of claim 1, wherein the laser comprises a $CO_2$ laser.

9. The method of claim 3, wherein the roll has a diameter between 5–60 times the thickness of the FFC.

10. The method of claim 5, wherein the roll has a diameter between 5–60 times the thickness of the FFC.

* * * * *